(12) United States Patent
Wong et al.

(10) Patent No.: US 7,714,568 B2
(45) Date of Patent: May 11, 2010

(54) POWER SUPPLY

(75) Inventors: Shih-Fang Wong, Taipei Hsien (TW); Tsung-Jen Chuang, Taipei Hsien (TW); Jun Zhang, Shenzhen (CN); Jun-Wei Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 55 days.

(21) Appl. No.: 11/952,142

(22) Filed: Dec. 7, 2007

(65) Prior Publication Data

US 2009/0027039 A1    Jan. 29, 2009

(30) Foreign Application Priority Data

Jul. 23, 2007    (CN) .................... 2007 1 0201154

(51) Int. Cl.
*G01R 7/00* (2006.01)
(52) U.S. Cl. ..................................... 324/142
(58) Field of Classification Search ....................... None
See application file for complete search history.

(56) References Cited

U.S. PATENT DOCUMENTS

| | | | | |
|---|---|---|---|---|
| 6,236,226 B1 * | 5/2001 | Hagiwara | .................. | 324/771 |
| 6,268,665 B1 | 7/2001 | Bobry | | |
| 6,614,217 B2 * | 9/2003 | Oohashi | .................. | 324/103 R |
| 6,624,635 B1 * | 9/2003 | Lui | .................. | 324/426 |
| 7,009,379 B2 * | 3/2006 | Ramirez | .................. | 324/142 |
| 7,135,850 B2 | 11/2006 | Ramirez | | |
| 7,609,081 B2 * | 10/2009 | Wong et al. | .................. | 324/765 |
| 2008/0042631 A1 * | 2/2008 | Wong et al. | .................. | 323/283 |
| 2009/0128173 A1 * | 5/2009 | Wong et al. | .................. | 324/754 |

* cited by examiner

*Primary Examiner*—Jermele M Hollington
(74) *Attorney, Agent, or Firm*—Frank R. Niranjan

(57) ABSTRACT

A power supply is for receiving an AC voltage and outputting a DC voltage and an output current to an electronic device. The power supply includes an input module, an output module, a measuring interface, a measuring interface, and a switch module. The input module is for receiving the AC voltage. The output module is for outputting the DC voltage and the output current to the electronic device. The measuring interface is for electrically contacting with a part of the electronic device. The measuring module is for measuring the DC voltage, the output current, and a voltage and a current of the part of the electronic device. The switch module is for choosing one of the output module and the measuring interface to be electrically connected to the measuring module.

16 Claims, 3 Drawing Sheets

POWER SUPPLY

BACKGROUND

1. Field of the Invention

The present invention generally relates to power supplies, and particular to a power supply for supplying power to an electronic device and measuring the performance of the electronic device as a digital multimeter.

2. Description of Related Art

A power supply and a digital multimeter are two dissimilar electronic instruments. The power supply is used to supply power to power up the electronic devices. The digital multimeter is used to measure various parameters, such as voltage, current, resistance, of the electronic devices.

In factories, laboratories, or any other places, the power supply and the digital multimeter are often used together to measure the performance of electronic devices. This is because neither the power supply can measure parameters nor can the digital multimeter supply power. Thus when taken individually, the power supply or the digital multimeter, cannot measure performance of an electronic device.

Therefore, a power supply is needed in the industry to address the aforementioned deficiencies and inadequacies.

SUMMARY

A power supply is used to measure the performance of an electronic device. The power supply is for receiving an AC voltage and outputting a DC voltage and an output current to an electronic device. The power supply includes an input module, an output module, a measuring interface, a measuring interface, and a switch module. The input module is for receiving the AC voltage. The output module is for outputting the DC voltage and the output current to the electronic device. The measuring interface is for electrically contacting with a part of the electronic device. The measuring module is for measuring the DC voltage, the output current, and a voltage and a current of the part of the electronic device. The switch module is for choosing one of the output module and the measuring interface to be electrically connected to the measuring module.

Other advantages and novel features of the present invention will become more apparent from the following detailed description of preferred embodiment when taken in conjunction with the accompanying drawings.

DETAILED DESCRIPTION OF THE EMBODIMENTS

Reference will now be made to the drawings to describe a preferred embodiment of the present power supply.

Figure 1:
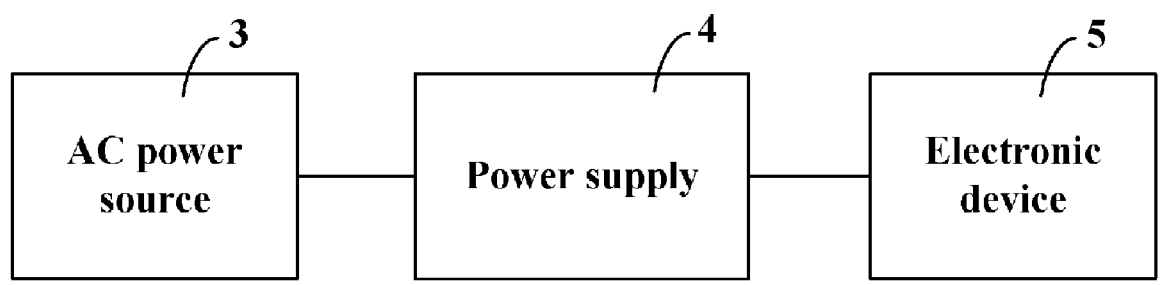
FIG. 1 is a schematic diagram showing a power supply in accordance with an exemplary embodiment.

Referring to FIG. 1, a power supply 4 in accordance with an exemplary embodiment is electrically connected to an alternative current (AC) power source 3 and an electronic device 5. The power supply 4 is used for converting an AC voltage from the AC power source 3 to a direct current (DC) voltage, and supplying the DC voltage to the electronic device 5. Further, the power supply 4 can also be used as a digital multimeter to measure various parameters of the electronic device.

Figure 2:
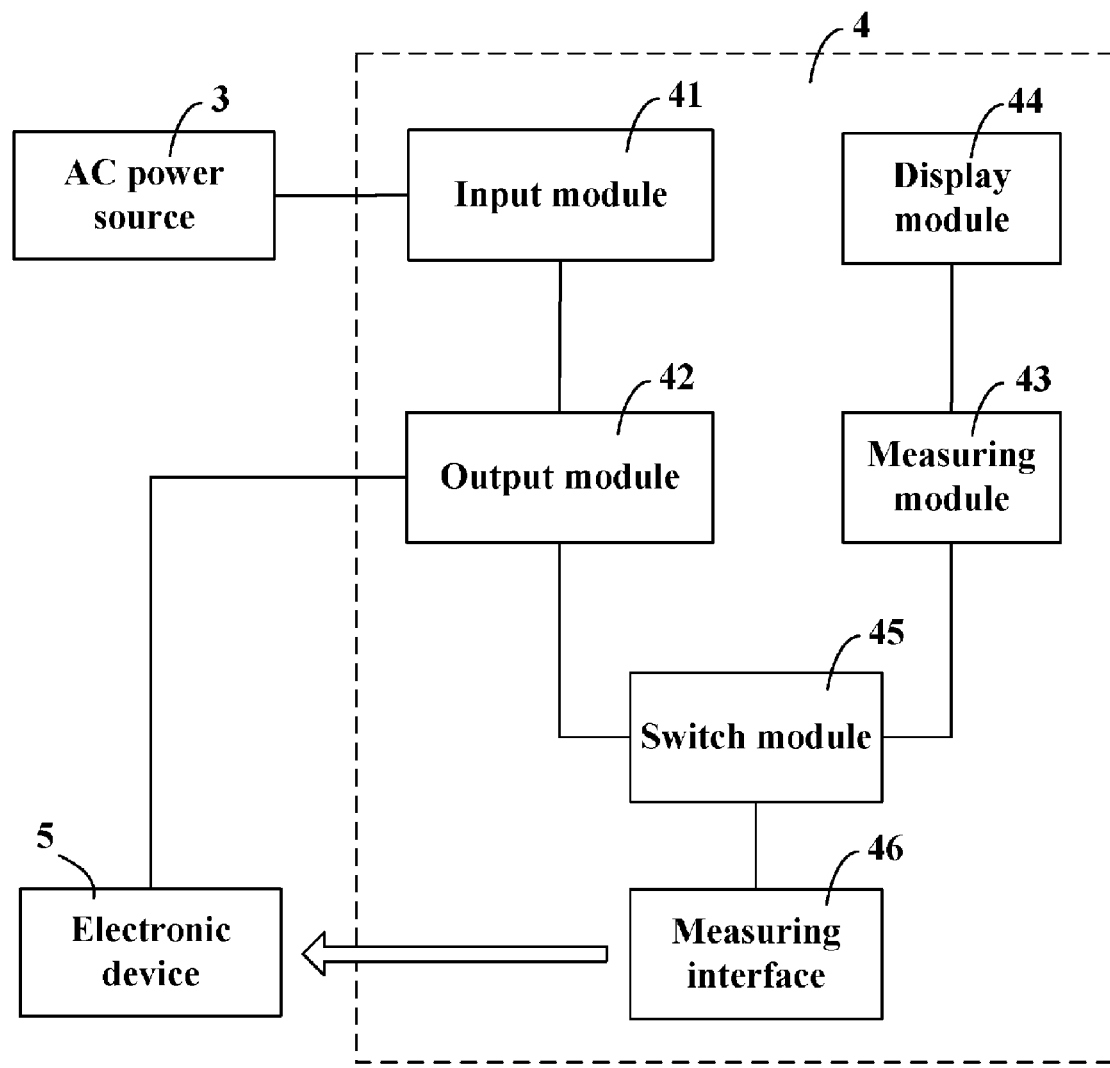
FIG. 2 is a schematic diagram showing the power supply of FIG. 1 in detail.

Referring to FIG. 2, the power supply 4 includes an input module 41, an output module 42, a measuring module 43, a display module 44, a switch module 45, and a measuring interface 46. The input module 41 is electrically connected to the AC power source 3 and the output module 42. The output module 42 is electrically connected to the electronic device 5 and the switch module 45. The switch module 45 is electrically connected to the measuring module 43 and the measuring interface 46. The measuring module 43 is electrically connected to the display module 44.

The input module 41 is for receiving the AC voltage from the AC power source 30, and converting the AC voltage to the DC voltage. The output module 42 is for receiving the DC voltage, and outputting the DC voltage and an output current corresponding to the DC voltage to the electronic device 5 to power up the electronic device 5. The switch module 45 is for choosing one of the output module 42 and the measuring interface 46 to be electrically connected to the measuring module 43. The measuring module 43 is for measuring performance of the power supply 4 by measuring the DC voltage and the output current from the output module 42. The measuring module 43 is also for measuring performance of the electronic device 5 by measuring a voltage and a current of a part of the electronic device 5 via the measuring interface 46. The measuring interface 46 is for electrically contacting with the part of the electronic device 5. The display module 44 is for displaying measuring results including the DC voltage, the output current, and the voltage and the current of the part of the electronic device 5.

Figure 3:
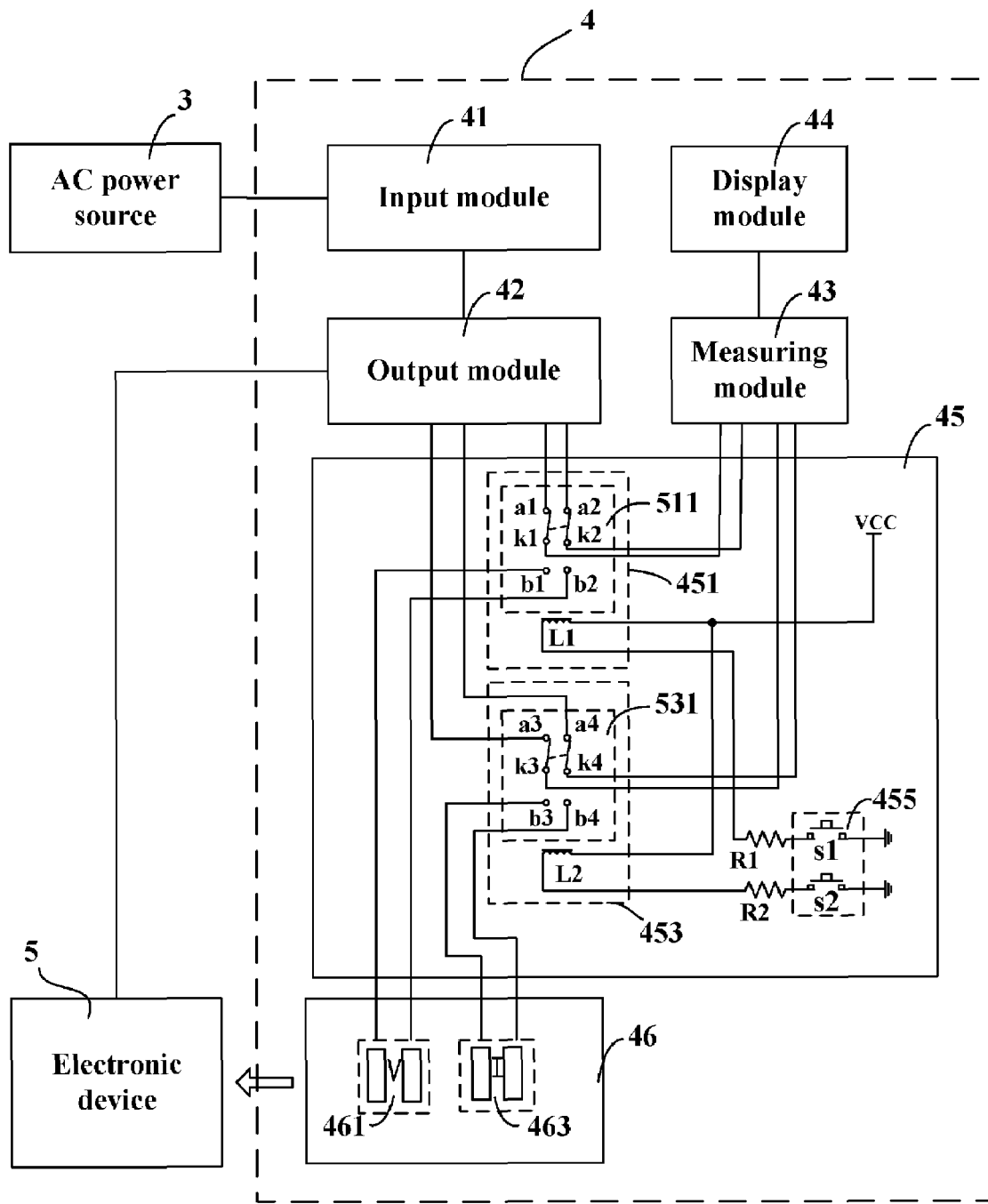
FIG. 3 is a schematic diagram showing a switch module of the power supply of FIG. 2.

Referring to FIG. 3, the switch module 45 includes a first relay 451, a second relay 453, a controller 455, and resistors R1, R2. The first relay 451 is electrically connected to the output module 42, the measuring module 43, and the measuring interface 46, and is for allowing the measuring module 43 to measure the DC voltage or the voltage of the part of the electronic device 5. The second relay 453 is electrically connected to the output module 42, the measuring module 43, and the measuring interface 46, and is for allowing the measuring module 43 to measure the output current or the current of the part of the electronic device 5. The controller 455 is electrically connected to the first relay 451 via the resistor R1 for controlling a state of the first relay 451, and electrically connected to the second relay 453 via the resistor R2 for controlling a state of the second relay 453.

The first relay 451 consists of a coil L1 and a double pole double throw (DPDT) switch 511. The DPDT switch 511 includes normally closed contacts a1, a2, normally open contacts b1, b2, and common contacts k1, k2. One end of the coil L1 is electrically connected to a DC power source VCC, and the other end of the coil L1 is electrically connected to one end of the resistor R1. The other end of the resistor R1 is electrically connected to the controller 455.

The second relay 453 consists of a coil L2 and a DPDT switch 531. The DPDT switch 531 includes normally closed contacts a3, a4, normally open contacts b3, b4, and common contacts k3, k4. One end of the coil L2 is electrically connected to the DC power source VCC, and the other end of the coil L2 is electrically connected to one end of the resistor R2. The other end of the resistor R2 is electrically connected to the controller 455.

The controller 455 includes momentary on-off switches S1, S2. One contact of the momentary on-off switch S1 is electrically connected to the resistor R1, and the other contact of the momentary on-off switch S2 is connected to ground. When a button (not labeled) of the momentary on-off switch S1 is depressed, the resistor R1 is connected to ground. One contact of the momentary on-off switch S2 is electrically connected to the resistor R2, and the other contact of the momentary on-off switch S2 is connected to ground. When a button (not labeled) of the momentary on-off switch S2 is depressed, the resistor R2 is connected to ground.

The measuring interface 46 includes a voltage measuring tool 461 and a current measuring tool 463. The voltage measuring tool 461 and the current measuring tool 463 are used to electrically contact with the part of the electronic device 5. Each of the voltage measuring tool 461 and the current measuring tool 463 can be a pair of probes or clips.

In operation, under normal conditions, the measuring module 43 is electrically connected to the output module 42 via the switch module 45, and the measuring module 43 measures the DC voltage and the output current. In this case, the buttons S1, S2 are released, and the common contacts k1, k2 are electrically connected to the normally closed contacts a1, a2 respectively, and the common contacts k3, k4 are electrically connected to the normally closed contacts a3, a4 respectively. The display module 44 displays the DC voltage and the output current.

When the measuring module 43 is used to measure the part of the electronic device 5, the buttons S1, S2 are depressed and the resistors R1, R2 are connected to ground. The coils L1, L2 are enabled as currents flows therethrough, thus the coils L1, L2 generate magnetic forces to shift the common contacts k1, k2, k3, k4. The common contacts k1, k2, k3, k4 are shifted to electrically contact with the normally open contacts b1, b2, b3, b4 respectively. The measuring module 43 is electrically connected to the measuring interface 46 via the switch module 45. The voltage measuring tool 461 and the current measuring tool 463 electrically contact with the part of the electronic device 5, and the measuring module 43 measures the voltage and the current of the part of the electronic device 5. The display module 44 displays the voltage and the current of the part of the electronic device 5.

As mentioned above, the power supply 4 uses a switch module 45 to select the measuring module 43 to measure the performance of the power supply 4 or to measure the performance of the electronic device 5. Therefore, the power supply 4 not only can supply power, but also can work as a digital multimeter.

It should be emphasized that the above-described preferred embodiment, is merely a possible example of implementation of the principles of the invention, and is merely set forth for a clear understanding of the principles of the invention. Many variations and modifications may be made to the above-described embodiment of the invention without departing substantially from the spirit and principles of the invention. All such modifications and variations are intended to be included herein within the scope of this disclosure and the present invention and be protected by the following claims.

What is claimed is:

1. A power supply for receiving an AC voltage and outputting a DC voltage and an output current to an electronic device, the power supply comprising:
   an input module configured to receive the AC voltage;
   an output module configured to output the DC voltage and the output current to the electronic device;
   a measuring interface configured to electrically contact with a part of the electronic device;
   a measuring module configured to measure the DC voltage, the output current, and a voltage and a current of the part of the electronic device; and
   a switch module operable to choose one of the output module and the measuring interface to be electrically connected to the measuring module; the switch module comprising:
   a first relay comprising a double pole double throw switch and a coil, the double pole double throw switch operable to allow the measuring module to measure the DC voltage or the voltage of the part of the electronic device;
   a second relay operable to allow the measuring module to measure the output current or the current of the part of the electronic device; and
   a controller electrically connected to the first relay via a first resistor and electrically connected to the second relay via a second resistor, the coil of the first relay being controlled by the controller to change states of the double pole double throw switch.

2. The power supply according to claim 1, wherein the double pole double throw switch comprises two normally closed contacts, two normally open contacts, and two common contacts, and the normally closed contacts are electrically connected to the output module, and the normally open contacts are electrically connected to the measuring interface, and the common contacts are electrically connected to the measuring module.

3. The power supply according to claim 2, wherein the measuring interface comprises a voltage measuring tool electrically connected to the normally open contacts, for electrically contacting with the part of the electronic device.

4. The power supply according to claim 1, wherein one end of the coil is for receiving a voltage, and the other end of the coil is electrically connected to the first resistor.

5. The power supply according to claim 1, wherein the second relay comprises a double pole double throw switch and a coil, and the double pole double throw switch is for allowing the measuring module to measure the output current or the current of the part of the electronic device, and the coil is controlled by the controller to change states of the double pole double throw switch.

6. The power supply according to claim 5, wherein the double pole double throw switch comprises two normally closed contacts, two normally open contacts, and two common contacts, and the normally closed contacts are electrically connected to the output module, and the normally open contacts are electrically connected to the measuring interface, and the common contacts are electrically connected to the measuring module.

7. The power supply according to claim 6, wherein the measuring interface comprises a current measuring tool electrically connected to the normally open contacts, for electrically contacting with the part of the electronic device.

8. The power supply according to claim 5, wherein one end of the coil is for receiving a voltage, and the other end of the coil is electrically connected to the second resistor.

9. The power supply according to claim 1, wherein the controller comprises a first momentary on-off switch and a second momentary on-off switch, and one contact of the first momentary on-off switch is electrically connected to the first resistor, and the other contact of the first momentary on-off switch is connected to ground, and one contact of the second momentary on-off switch is electrically connected to the second resistor, and the other contact of the second momentary on-off switch is connected to ground.

10. The power supply according to claim 1, further comprising a display module for displaying the DC voltage, the output current, and the voltage and the current of the part of the electronic device.

11. A power supply comprising:
- an input module for receiving the AC voltage;
- an output module for outputting the DC voltage and the output current to the electronic device;
- a measuring module for measuring the DC voltage, the output current, and a voltage and a current of a part of the electronic device;
- a measuring interface being electrically connected to the measuring module, and electrically contacting with the part of the electronic device; and
- a switch module comprising a first relay and a controller, the first relay comprising a first double pole double throw switch and a first coil, the first double pole double throw switch being for choosing one of the output module and the measuring interface to be electrically connected to the measuring module, and the first coil being controlled by the controller to change states of the first double pole double throw switch.

12. The power supply according to claim 11, wherein one end of the first coil receives a voltage, and the other end of the first coil is electrically connected to the controller via a first resistor.

13. The power supply according to claim 12, wherein the controller comprises a first momentary on-off switch, one contact of the first momentary on-off switch is electrically connected to first coil via the first resistor, and the other contact of the first momentary on-off switch is connected to ground.

14. The power supply according to claim 11, wherein the switch module further comprises a second relay, the second relay comprises a second double pole double throw switch and a second coil, the second double pole double throw switch is for choosing one of the output module and the measuring interface to be electrically connected to the measuring module, and the second coil is controlled by the controller to change states of the second double pole double throw switch.

15. The power supply according to claim 14, wherein one end of the second coil receives a voltage, and the other end of the second coil is electrically connected to the controller via a second resistor.

16. The power supply according to claim 15, wherein the controller comprises a second momentary on-off switch, one contact of the second momentary on-off switch is electrically connected to second coil via the second resistor, and the other contact of the second momentary on-off switch is connected to ground.

* * * * *